United States Patent
Hladik et al.

(10) Patent No.: US 6,594,792 B1
(45) Date of Patent: Jul. 15, 2003

(54) MODULAR TURBO DECODER FOR EXPANDED CODE WORD LENGTH

(75) Inventors: Stephen Michael Hladik, Albany, NY (US); Abdallah Mahmoud Itani, Ballston Spa, NY (US); Nick Andrew Van Stralen, Ballston Spa, NY (US); Robert Gideon Wodnicki, Schenectady, NY (US); John Anderson Fergus Ross, Del Mar, CA (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 09/561,333

(22) Filed: Apr. 28, 2000

Related U.S. Application Data

(60) Provisional application No. 60/132,027, filed on Apr. 30, 1999.

(51) Int. Cl.[7] .................. H03M 13/29; H03M 13/45
(52) U.S. Cl. .................. 714/755; 714/780; 714/794
(58) Field of Search .................. 714/755, 780, 714/786, 794

(56) References Cited

U.S. PATENT DOCUMENTS

| | | | |
|---|---|---|---|
| RE32,905 E | | 4/1989 | Baran .................. 370/104 |
| 5,349,589 A | | 9/1994 | Chennakeshu et al. ....... 371/43 |
| 5,406,570 A | | 4/1995 | Berrou et al. .................. 371/43 |
| 5,446,747 A | | 8/1995 | Berrou .................. 371/45 |
| 5,721,745 A | | 2/1998 | Hladik et al. .................. 371/43 |
| 5,721,746 A | | 2/1998 | Hladik et al. .................. 371/43 |
| 5,734,962 A | | 3/1998 | Hladik et al. .................. 455/12.1 |
| 6,252,917 B1 | * | 6/2001 | Freeman .................. 375/340 |
| 6,271,772 B1 | * | 8/2001 | Luschi et al. .................. 341/51 |
| 6,484,283 B2 | * | 11/2002 | Stephen et al. .............. 714/786 |

FOREIGN PATENT DOCUMENTS

| | | |
|---|---|---|
| EP | 0 735 696 | 10/1996 |
| FR | 2 675 970 | 10/1992 |

OTHER PUBLICATIONS

"Turbo Code Decoder with Controlled Probability Estimate Feedback," JAF Ross; SM Hladik; NA VanStralen, JB Anderson, Ser. No. 09/137,257, filed Aug. 20, 1998.

"Turbo Code Decoder with Modified Systematic Symbol Transition Probabilities," SM Hladik; JAF Ross; NA Van-Stralen; Ser. No. 09/137,256, filed Aug. 20, 1998.

"A Maximum a Posteriori Estimator with a Fast Sigma Calculator," JAF Ross; AM Itani; NA VanStralen; SM Hladik; Ser. No. 09/137,260, filed Aug. 20, 1998.

(List continued on next page.)

Primary Examiner—Stephen M. Baker
(74) Attorney, Agent, or Firm—John F. Thompson; Patrick K. Patnode

(57) ABSTRACT

A turbo decoder system utilizing a MAP decoding algorithm has a predetermined number of turbo decoder modules for decoding segments of a turbo code component code word in parallel, thereby expanding the block-length and data-rate capability of the turbo decoder system. Input data samples are provided to an interleaver/de-interleaver module wherein they are divided into segments of predetermined size, each segment being provided to a respective turbo decoder module. The outputs of each turbo decoder module are a posteriori probabilities which are re-ordered in the interleaver/de-interleaver module, segmented, and provided back to the turbo decoders as a priori information-bit probabilities. For the case of a turbo code comprising two component codes, the a posteriori information-bit probabilities are re-ordered according to the interleaver definition at the end of odd-numbered half iterations, while at the end of even-numbered half iterations, they are re-ordered according to the de-interleaver definition. Decoding continues until the desired number of iterations have been performed. Data decisions are made on the final a posteriori bit probability estimates.

6 Claims, 5 Drawing Sheets-

OTHER PUBLICATIONS

"High–Data Rate Maximum a Posteriori Decoder for Segmented Trellis Code Words," SM Hladik; NA VanStralen; JAF Ross; Ser. No. 09/137,181, filed Aug. 20, 1998.

"Turbo Decoder Control for Use with a Programmable Interleaver, Variable Block Length, and Multiple Code Rates," NA VanStralen; SM Hladik; AM Itani; RG Wodnicki; JAF Ross; Ser. No. 09/519,903, filed Mar. 7, 2000.

"Turbo Decoder with Modified Input for Increased Code Word Length And Data Rate," SM Hladik; AM Itani; NA VanStralen; RG Wodnicki; JAF Ross; Ser. No. 09/561,334, filed Apr. 28, 2000.

"The Turbo Coding Scheme," Jakob Dahl Anderson, Report IT–146 ISSN 0105–854, Jun. 1994, Revised Dec. 1994, pp. 1–48.

"An Efficient Adaptive Circular Viterbi Algorithm for Decoding Generalized Tailbiting Convolutional Codes," Richard V. Cox, Car–Erik W. Sundberg; IEEE Transactions on Vehicular Technology, vol. 43, No. 1, Feb. 1994, pp. 57–68.

"On Tail Biting Convolutional Codes," Howard H. Ma; Jack K. Wolf, IEEE Transactions on Communications, vol. Com–34, No. 2, Feb., 1990, pp. 104–111.

"An Efficient Maximum Likelihood Decoding Algorithm For Generalized Tailbiting Convolutional Codes Including Quasicyclic Codes," Qiang Wang and Vijay K. Bhargava, IEEE Transactions on Communications, vol. 37, No. 8, Aug. 1989, pp. 875–879.

"Illuminating the Structure of Code and Decoder of Parallel Concatenated Recursive Systematic (Turbo) Codes," Patrick Robertson, IEEE, 1994, pp. 1298–1303.

"Near Shannon Limit Error–Correcting Coding and Decoding: Turbo–Codes (1)," Claude Berrou, Alain Glavieux, Punya Thitimajshima, IEEE, 1993, pp. 1064–1070.

"Optimal Decoding of Linear Codes for Minimizing Symbol Error Rate," LR Bahl; J Cocke; F. Jelinek; J. Raviv; IEEE Transactions on Information Theory, Mar. 1974, pp. 284–287.

"Near Optimum Error Correcting Coding and Decoding: Turbo–Codes," Claude Berrou; IEEE Transactions on Communications, vol. 44, No. 10, Oct. 1996, pp. 1261–1271.

"A Comparison of Optimal and Sub–Optimal Map Decoding Algorithms Operating in the Log Domain," Patrick Robertson; Emmanuelle Villebrun; Peter Hoeher; IEEE 1995, pp. 1009–1013.

"Terminating the Trellis of Turbo–Codes in the Same State," AS Barbulescu; SS Pietrobon, Electronics Letters Jan. 5, 1995 vol. 31, No. 1, pp. 22–23.

"Terminating the Trellis of Tubo–Codes," O. Joerssen; H. Meyr; Electronics Letters Aug. 4, 1994 vol. 30, No. 16, pp. 1285–1286.

"A Viterbi Algorithm with Soft–Decision Outputs and its Applications," Joachim Hagenauer; Peter Hoeher; IEEE 1989, pp. 1680–1686.

"Decision Depths of Convolutional Codes," John B. Anderson; Kumar Balachandran; IEEE Transactions on Information Theory, vol. 35, No. 2, Mar. 1989, pp. 455–459.

"Source and Channel Coding, an Algorithmic Approach," John B. Anderson; Seshadri Mohan, pp. 216, 336–342.

* cited by examiner

MODULAR TURBO DECODER FOR EXPANDED CODE WORD LENGTH

CROSS REFERENCE TO RELATED APPLICATIONS

This application claims the benefit of U.S. Provisional Application No. 60/132,027, filed Apr. 30, 1999.

BACKGROUND OF THE INVENTION

The present invention relates generally to error-correction coding and, more particularly, to a decoder for parallel convolutional codes, i.e., turbo codes.

A new class of forward error control codes, referred to as turbo codes, offers significant coding gain for power limited communication channels. Turbo codes are generated using two or more recursive systematic encoders operating on different orderings of the same information bits. A subset of the code bits generated by each encoder is transmitted in order to maintain bandwidth efficiency. Turbo decoding involves an iterative algorithm in which probability estimates of the information bits that are calculated for one of the received component code words are fed back to a probability estimator comprising the decoder component code words for the other component code words. Each iteration of decoder processing generally increases the reliability of these probability estimates. This process continues, cyclically decoding the component code words until the probability estimates can be used to make reliable decisions.

The maximum a posteriori (MAP) type algorithm introduced by Bahl, Cocke, Jelinek, and Raviv in "Optimal Decoding of Linear Codes for Minimizing Symbol Error Rate", *IEEE Transactions on Information Theory*, March 1974, pp. 284–287, is particularly useful as a component decoder in decoding parallel concatenated convolutional codes, i.e., turbo codes. The MAP algorithm is used in the turbo decoder to generate a posteriori probability estimates of the information bits that have been encoded into the code word. These probability estimates are used as a priori bit probabilities for the second MAP decoder. Three fundamental terms in the MAP algorithm are the forward and backward state probability functions (the alpha and beta functions, respectively) and the a posteriori transition probabilities (the sigma functions).

A known characteristic of turbo codes is that their error correction capability increases with code word length. However, there is some practical limit on the length of a code word that can be decoded with a MAP-algorithm decoder implementation. Accordingly, it is desirable to provide a modular turbo decoder structure capable of decoding longer code word lengths. It is furthermore desirable to provide such a turbo decoder while increasing coding gain and data rate.

BRIEF SUMMARY OF THE INVENTION

A turbo decoder system utilizing a MAP decoding algorithm comprises a predetermined number M of turbo decoder modules for decoding segments of a turbo code component code word in parallel, thereby expanding the block-length and data-rate capability of the turbo decoder system. In an exemplary system, each turbo decoder module has a predetermined maximum code-word size corresponding to N information bits, and a predetermined maximum decoding rate. Input data samples from a received code word, corresponding to M·N information bits, are provided to an interleaver/de-interleaver module wherein they are divided into segments of predetermined size, each segment being provided to a respective turbo decoder module. The output of each turbo decoder module comprises a posteriori probabilities which are re-ordered in the interleaver/de-interleaver module, segmented, and provided back to the turbo decoders as a priori information bit probabilities. For the case of a turbo code comprising two component codes, the a posteriori information-bit probabilities are re-ordered according to the interleaver definition at the end of odd-numbered half iterations, while at the end of even-numbered half iterations, they are re-ordered according to the de-interleaver definition. Decoding continues until the desired number of iterations have been performed. Then, data decisions are made on the final a posteriori bit probability estimates.

DETAILED DESCRIPTION OF THE INVENTION

Figure 1:
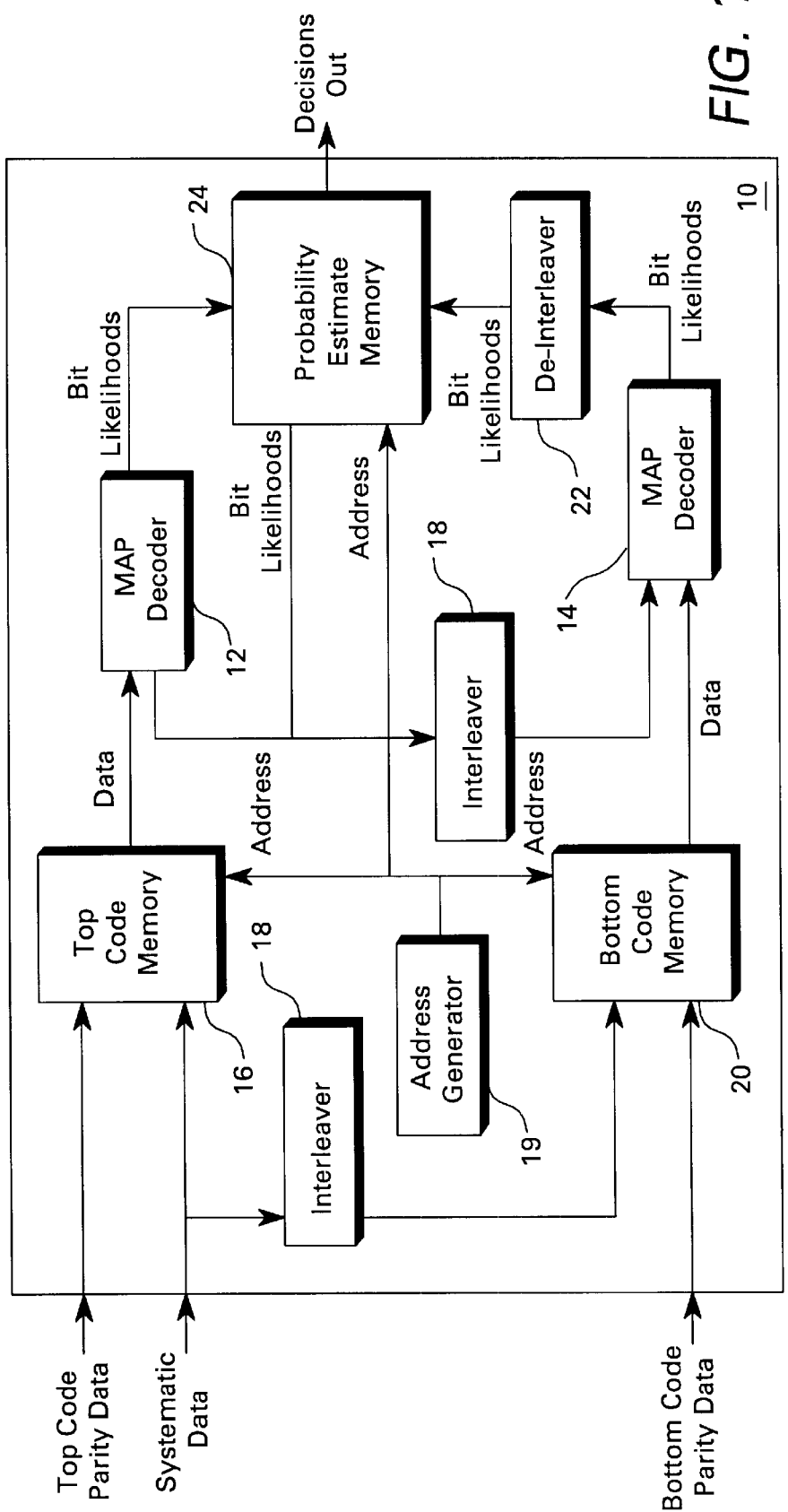
FIG. 1 is a block diagram illustrating a typical turbo decoder utilizing a MAP decoding algorithm.

A turbo decoder is described herein with particular reference to a MAP decoding algorithm as a turbo decoding algorithm. However, other suitable turbo decoding algorithms may be employed using the principles of the present invention, such as, for example, a SOVA decoding algorithm.

A MAP decoder provides estimates of the a posteriori probabilities of the states and transitions of a Markov source through a discrete memory-less channel. The transition probabilities of a discrete memory-less channel depend on the transitions $X_1^\tau$ of the Markov source and the observations $Y_1^\tau$ such that for a sequence, $$Pr\{Y_1^t \mid X_1^t\} = \prod_{j=1}^{t} R(Y_j \mid X_j) \qquad 1$$

where $R(\cdot|\cdot)$ defines the channel transition probabilities.

The MAP decoder uses the received sequence $Y_1^\tau$ to estimate the a posteriori state and transition probabilities of the Markov source.

$$Pr\{S_t = m \mid Y_1^\tau\} = Pr(S_t = m; Y_1^\tau)/Pr\{Y_1^\tau\} \qquad 2$$
$$= \lambda_t(m)/Pr\{Y_1^\tau\}$$

and

-continued $$Pr\{S_{t-1} = m'; S_t = m \mid Y_1^\tau\} = Pr\{S_{t-1} = m'; S_t = m; Y_1^\tau\}/Pr\{Y_1^\tau\} \quad 3$$
$$= \sigma_t(m', m)/Pr\{Y_1^\tau\}$$

where $S_t$ is the state of the source at time t.

The alpha, beta and gamma functions are defined as follows:

$$\alpha_t(m) = Pr\{S_t = m; Y_1^t\} \quad 4$$

$$\beta_t(m) = Pr\{Y_{t+1}^\tau \mid S_t = m\} \quad 5$$

and $$\gamma_t(m', m) = Pr\{S_t = m; Y_t \mid S_{t-1} = m'\} \quad 6$$

so that $$\lambda_t(m) = \alpha_t(m) \cdot \beta_t(m) \quad 7$$

and $$\sigma_t(m', n) = \alpha_{t-1}(m') \cdot \gamma_t(m', m) \cdot \beta_t(m) \quad 8$$

The alpha function can be computed from the following recursion:

$$a_t(m) = \sum_{m'} \alpha_{t-1}(m') \cdot \gamma_t(m', m). \quad 9$$

The beta function can be calculated using the following recursion:

$$\beta_t(m) = \sum_{m'} \beta_{t+1}(m') \cdot \gamma_{t+1}(m, m'). \quad 10$$

Finally, the gamma function can be calculated as follows:

$$\gamma_t(m', m) = \sum_X p_t(m \mid m') \cdot q_t(X \mid m', m) \cdot R(Y_t, X), \quad 11$$

where $p_t(m|m')$ are the transition probabilities of the Markov source, and $q_t(X|m',m)$ is the distribution of the source's output symbols conditioned on the source's state transitions.

By way of illustration, the most common case of a turbo code comprising two component codes is described herein, but it is to be understood that the invention described herein applies generally to other turbo codes. For the exemplary case, turbo codes are constructed as two recursive systematic codes concatenated in parallel. A MAP decoder for a turbo code generates a probability estimate of the information bits in a component code word, based on one of the two recursive systematic codes comprising the turbo code, and provides these probability estimates to a second MAP decoder which decodes the other component code word of the turbo code word. The second decoder uses these probabilities as a priori information and generates new probability estimates of the information bits encoded in the code word. The updated estimates are provided to the first MAP component decoder, which, in turn, generates updated estimates. This feedback process continues a finite number of times, and a decision on the information bits is made based on the final probability estimates. Each operation of a component MAP decoder is referred to as a half iteration.

The two parallel component codes in a turbo code are referred to herein as the top code and the bottom code. Normally, the data is encoded by the top code and is interleaved using either a fixed-block interleaver or a random interleaver before being encoded by the bottom code.

FIG. 1 illustrates a turbo decoder 10 employing component MAP decoders 12 and 14. The inputs to the turbo decoder of FIG. 1 are elements of the composite turbo code word. The systematic data is a sequence of symbols that correspond to the information bits; the top-code parity data are symbols that correspond to the parity bits generated by the top component encoder; and the bottom code parity data are symbols that correspond to the parity bits generated by the bottom component encoder of the turbo encoder. As shown, the top code parity data is provided along with the systematic data to a top code memory 16 and then to MAP decoder 12. The systematic data is also provided, via an interleaver 18, along with the bottom code parity data to a bottom code memory 20 and then to the second MAP decoder 14. FIG. 1 also shows the feedback loop involving MAP decoders 12 and 14, interleaver 18, de-interleaver 22, a probability estimate memory 24, and an address generator 19 for implementing a MAP decoding algorithm as described hereinabove.

The systematic (i.e., information) bit probability estimates are computed using the a posteriori transition or $\sigma_t(m',m)$ probabilities. The sum of all a posteriori state transition probabilities resulting from the same information bit value is the a posteriori probability bit estimate. The output of a MAP component decoder is an a posteriori probability estimate of the information bits, denoted as $APP_t(0)$ and $APP_t(1)$, as set forth in the following expression:

$$APP_t(k) = Pr\{d_t = k \mid Y_1^\tau\} \quad 12$$
$$= \sum \sigma_t(m', m)$$

where the summation is over all $\sigma_t(m',m)$ values where the information bit corresponding to the state transition (m',m) is k.

The calculated a posteriori systematic bit probabilities are stored in memory as likelihood ratios, that is, $APP_t(1)/APP_t(0)$.

Although the description herein is given with respect to non-logarithmic functions, it is to be understood that a logarithmic implementation is preferred for many applications. To this end, the mathematical expressions herein may be converted to logarithmic expressions in known fashion.

Figure 2:
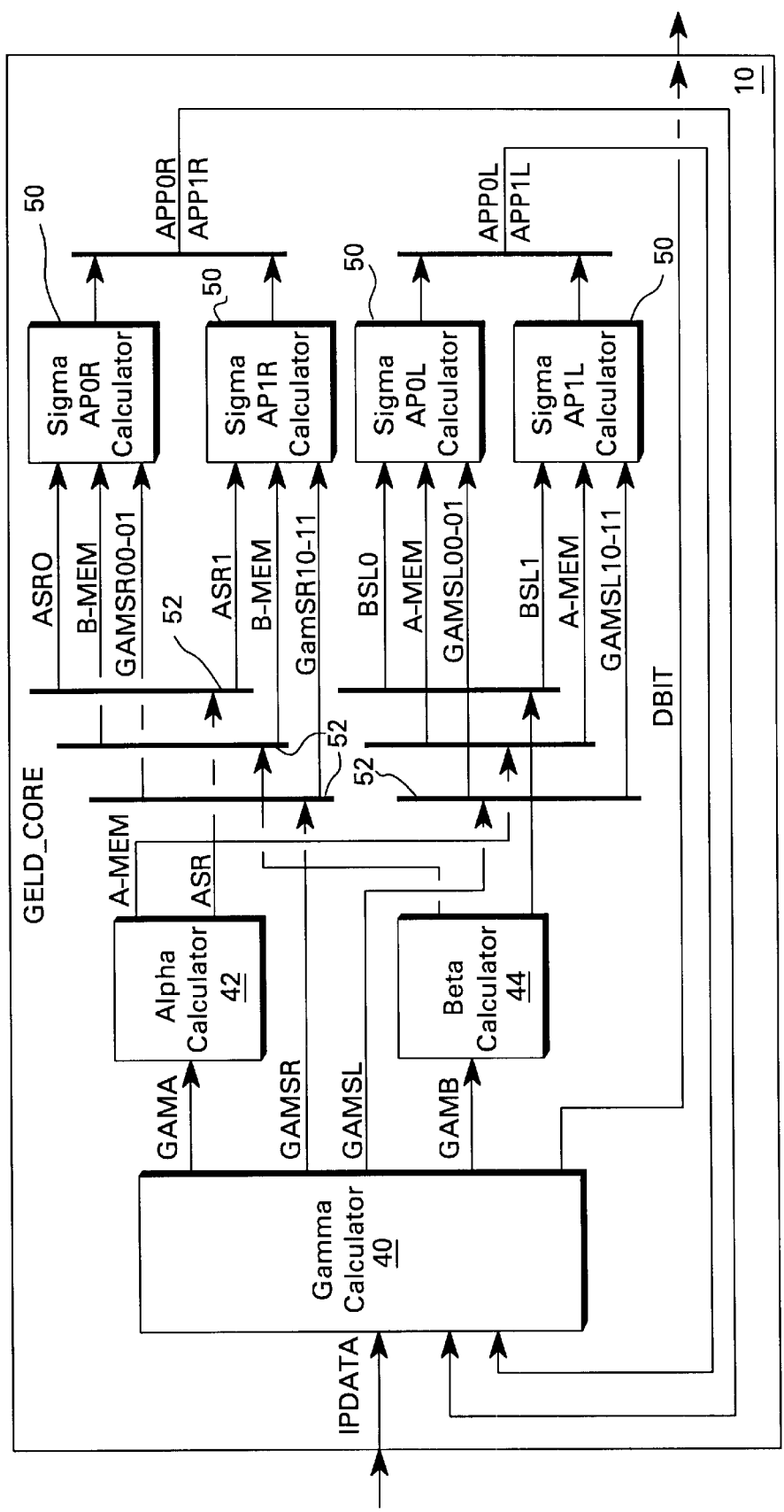
FIG. 2 is a block diagram illustrating a top level view of data flow in a MAP component decoder such as that of FIG. 1.

FIG. 2 is a top level view illustrating an exemplary turbo decoder data flow structure. The functional blocks within the turbo decoder in the data path are the gamma calculator block 40, the alpha calculator block 42, the beta calculator block 44, and the sigma calculator blocks 50. Received symbols IPDATA and the a posteriori bit probability estimates from the sigma blocks are provided as inputs to the gamma block. Four gamma values are outputted from the gamma block, one gamma value being provided to each of the alpha and beta blocks (GAMA and GAMB, respectively); and the other gamma values (GAMSR and GAMSL) being provided via multiplexers 52 to the sigma blocks along with the present alpha and beta values (ASR, BSL) and the alpha and beta values stored in memory (A-MEM and B-MEM).

As illustrated, four sigma blocks 50 calculate the sigma values for the state transitions in the code's trellis. These blocks also compute an update of the a posteriori probability associated with each of the information (systematic) bits in the code word. The probability of the transmitted bit being zero (APOR, APOL) is computed simultaneously with the probability of the bit being one (APIR, APIL). Since symbol-by-symbol MAP decoding involves both forward (from the beginning to the end of the received component code word) and backward (from the end to the beginning of the received component code word) recursive calculations, as described in U.S. patent application Ser. No. 09/137,260, filed Aug. 20, 1998, the turbo decoder processes the received symbols comprising the received component code words of the received turbo code word sequentially from the first received to the last received for the forward recursion and from the last received symbol to first for the backward recursion substantially simultaneously. These operations are performed in parallel in order to minimize the delay which would otherwise result from serial sigma block calculations.

Figure 3:
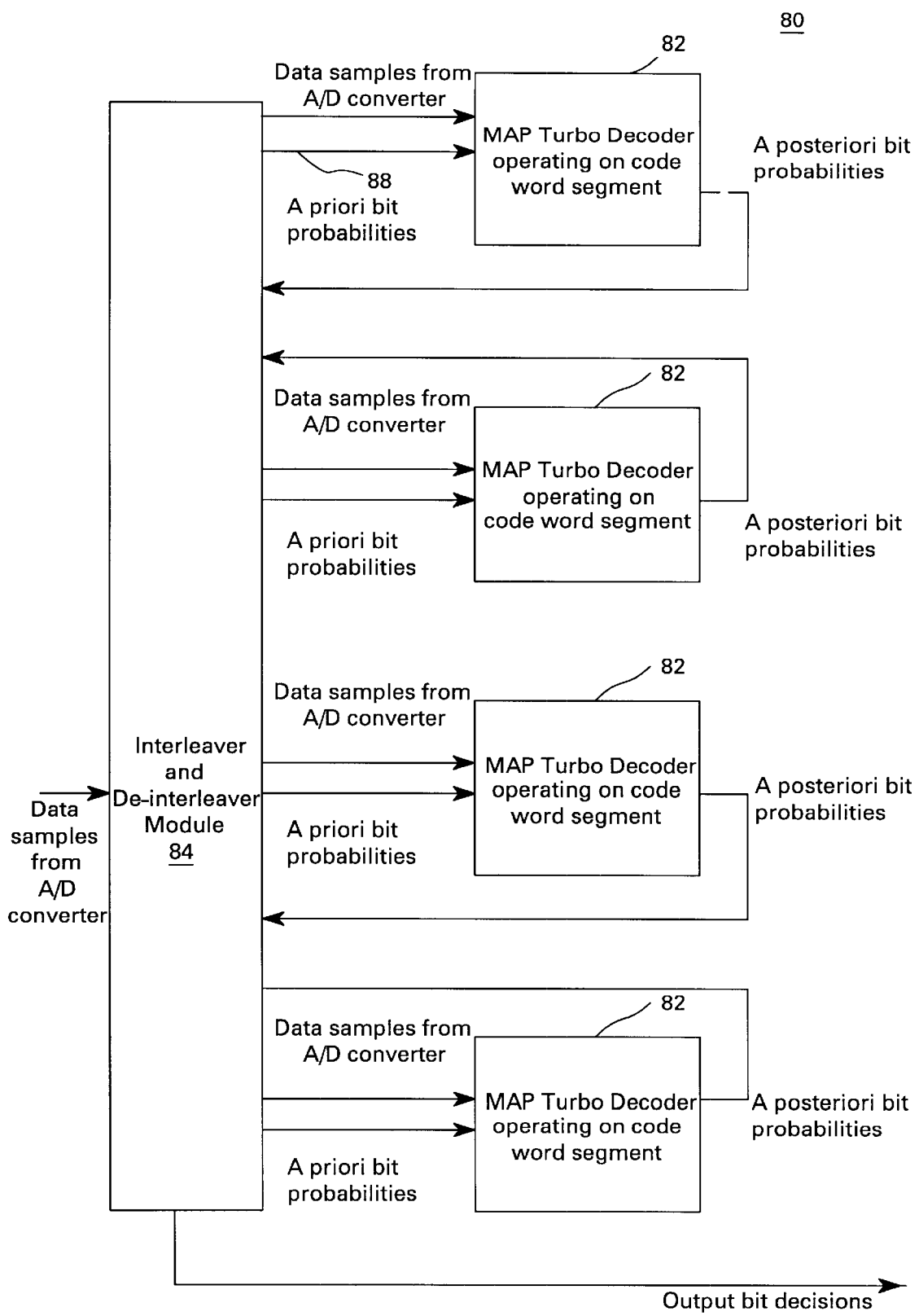
FIG. 3 is a block diagram illustrating an exemplary embodiment of a turbo decoder system of the present invention.

FIG. 3 illustrates data flow through a turbo decoding system 80 employing multiple (e.g., four) turbo decoder modules, or chips, 82 for decoding a code word which exceeds the maximum length each respective chip is capable of decoding. System 80 is illustrated as comprising an interleaver/de-interleaver module 84 which receives data comprising turbo code words from an analog-to-digital (A/D) converter (not shown). Each turbo code word comprises information bits and parity bits. Interleaver/de-interleaver module 84 divides the received turbo code words into multiple segments, each respective segment being provided to a respective decoder chip 82. For the first half iteration of the turbo decoder MAP decoding algorithm, the inputted segments respectively correspond to those required to decode the top component code word. The turbo decoding of the code word segments for the first half iteration is performed simultaneously by the multiple turbo decoder chips. That is, the respective segments of the same turbo code word are decoded in parallel by the multiple chips. Upon completion of the first half iteration of decoding, a posteriori bit probability signals (APP's) are provided to the interleaver/de-interleaver module wherein they are re-ordered according to the interleaver definition therein. The interleaver (and de-interleaver) length corresponds to the total length of the received composite turbo code word, i.e., before segmenting.

Advantageously, the interleaving/de-interleaving function adds only minimal delay. That is, the a posteriori bit probability values are provided from the multiple turbo decoder chips simultaneously, these probability values being routed and inputted via the interleaver definition block to the respective turbo decoder chip for the next half iteration. This signal path provides only minimal delay (e.g., a few cycles of master clock delay) between receiving the a posteriori bit probability values and loading them as a priori probability values for the next iteration.

At or before the start of the second half iteration, data samples corresponding to bottom component code word are provided as inputs to the respective turbo decoder chips. Again the component code word is divided into multiple segments, with a respective turbo decoder operating on a different section of the code word. At the end of the second half iteration, the a posteriori bit probability outputs of the individual decoders are again passed through the interleaver/de-interleaver function block wherein they are again re-ordered, albeit this time with the de-interleaver definition. After de-interleaving, these values are associated with the corresponding elements of each segment of the top component code (in like manner as the first half iteration) and provided to the respective decoders for the third half iteration. In an exemplary embodiment, the same turbo decoder chips are used to decode the same segments as in the first iteration such that the data samples needed for the third half iteration have already been provided to the decoders and may be retained in memory.

Upon completion of any half iteration, the a posteriori bit probability estimates are provided as inputs to the interleaver/de-interleaver function block wherein they are re-ordered, segmented, and provided back into the decoders as a priori bit probabilities. At the end of odd-numbered half iterations, the a posteriori bit probabilities are re-ordered according to the interleaver definition, while at the end of even-numbered half iterations, they are re-ordered according to the de-interleaver definition. Decoding continues until the desired number of half iterations have been performed. Decoding decisions are typically made based on the final a posteriori probability estimates.

Each respective decoder chip is preferably used for decoding the corresponding segments of each code word, or frame, each time an odd or even numbered half iteration is performed. In this way, memory internal to the decoder can be used to store the required samples for the segments, and the data samples do not have to be entered into the decoders multiple times. It should also be noted that the a priori bit probabilities do not have to be entered into the decoders before the first iteration because at the start of the first half iteration, if the bit=0 hypothesis and the bit=1 hypothesis are assumed to be equally likely, and hence can be generated internally to the decoder.

The only data samples required to be inputted to each respective decoder chip are those for the segment of the code word being decoded by a specific decoder. As an example, an exemplary turbo decoder is capable of decoding a code word having 1024 information bits. A turbo decoder system such as that of FIG. 3 can be used to decode turbo code word generated by a block of 4096 information bits by using four of such 1024-bit chips, each respective turbo decoder chip having 1024 data samples (plus parity, merge and tail bits) entered for the top and bottom component of each chip. In addition, there is a decoding data rate advantage provided by this embodiment of the invention. That is, the decoding time for the frame would be similar or identical to the time elapsed if a single chip were to decode a 1024 block length code because the overhead associated with the interleave/de-interleave function is minimal. For the example herein, i.e., for a block length of 4096 bits, the four chips decode at four times the data rate as a single chip. Thus, there is a quadrupling of the data rate by using the four chips.

As an alternative embodiment, turbo decoder modules 82 may employ a common input bus for both the data samples and the a priori bit probability values. This is illustrated in FIG. 3 in phantom as bus 88 replacing the two illustrated input buses. The data samples needed to decode the segments for both the top and bottom component codes are provided to the decoder prior to the start of the first half iteration. The common input bus can be used exclusively for inputting data samples at this time because the a priori bit probability estimates for the first iteration can be easily generated internally to the individual chips. After the first iteration, the common input bus is used exclusively for input a priori bit probabilities obtained from the a posteriori bit probabilities that are fed back as a result of the previous decoding iteration. This is possible because the data samples needed for all iterations (odd and even numbered) can be stored internally in double buffers. (Such double buffers may be loaded with non-interleaved and interleaved data at the start of each new code word, resulting in reduced input/output processing delays.) The common input bus 88 must be at least as wide (i.e., with respect to the number of bits of precision) as the larger of the A/D data or the input a priori bit probabilities. In an exemplary turbo decoder having 6-bit input data samples and 9-bit a priori bit probabilities, a shared bus would have at least 9 bits.

Figure 4:
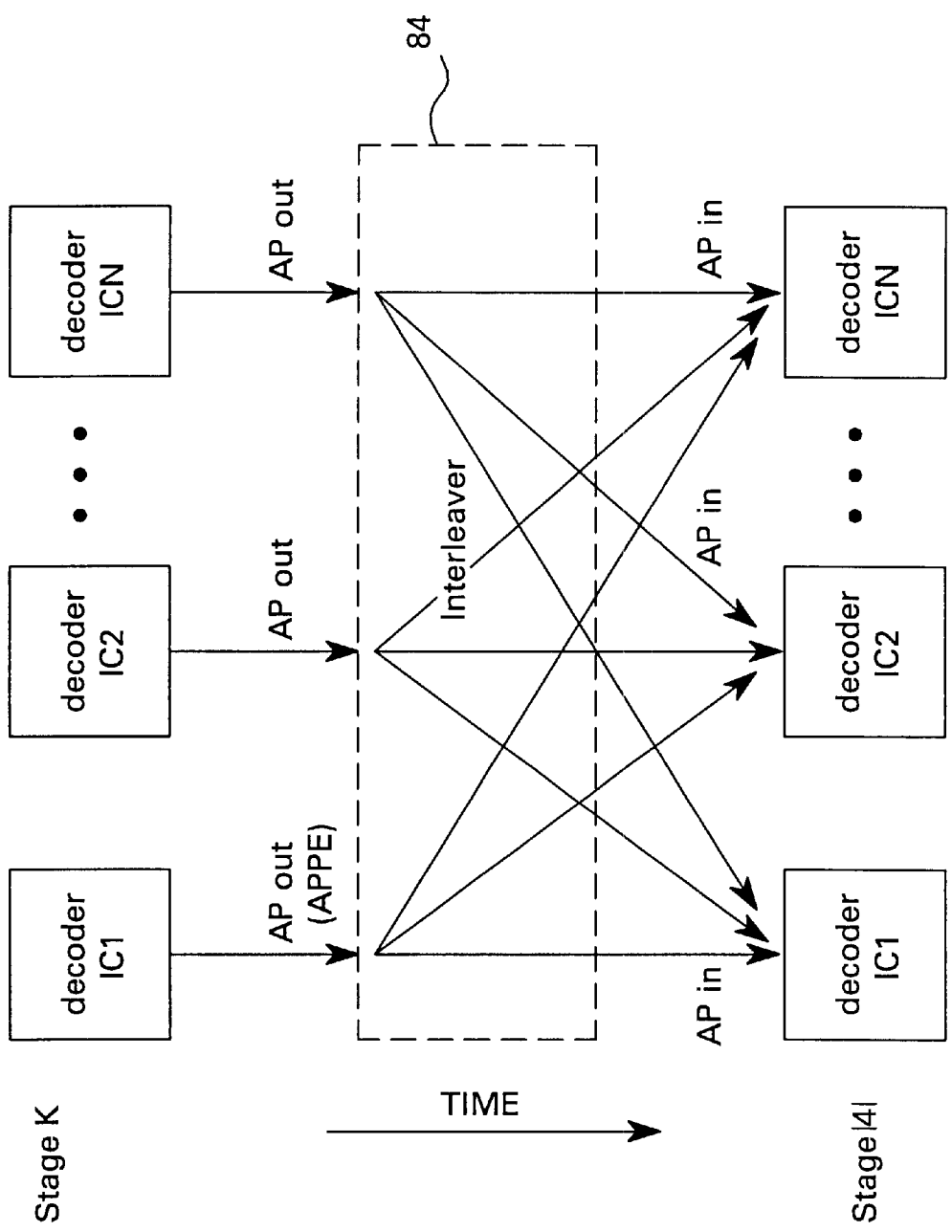
FIG. 4 is a block diagram illustrating an exemplary interleaver/de-interleaver module definition useful in a system according to the present invention.

FIG. 4 illustrates an interleaver's function useful for the turbo decoder structure described herein. Note that all the integrated circuits operate simultaneously, giving N times the throughput when N decoder chips are used.

Figure 5:
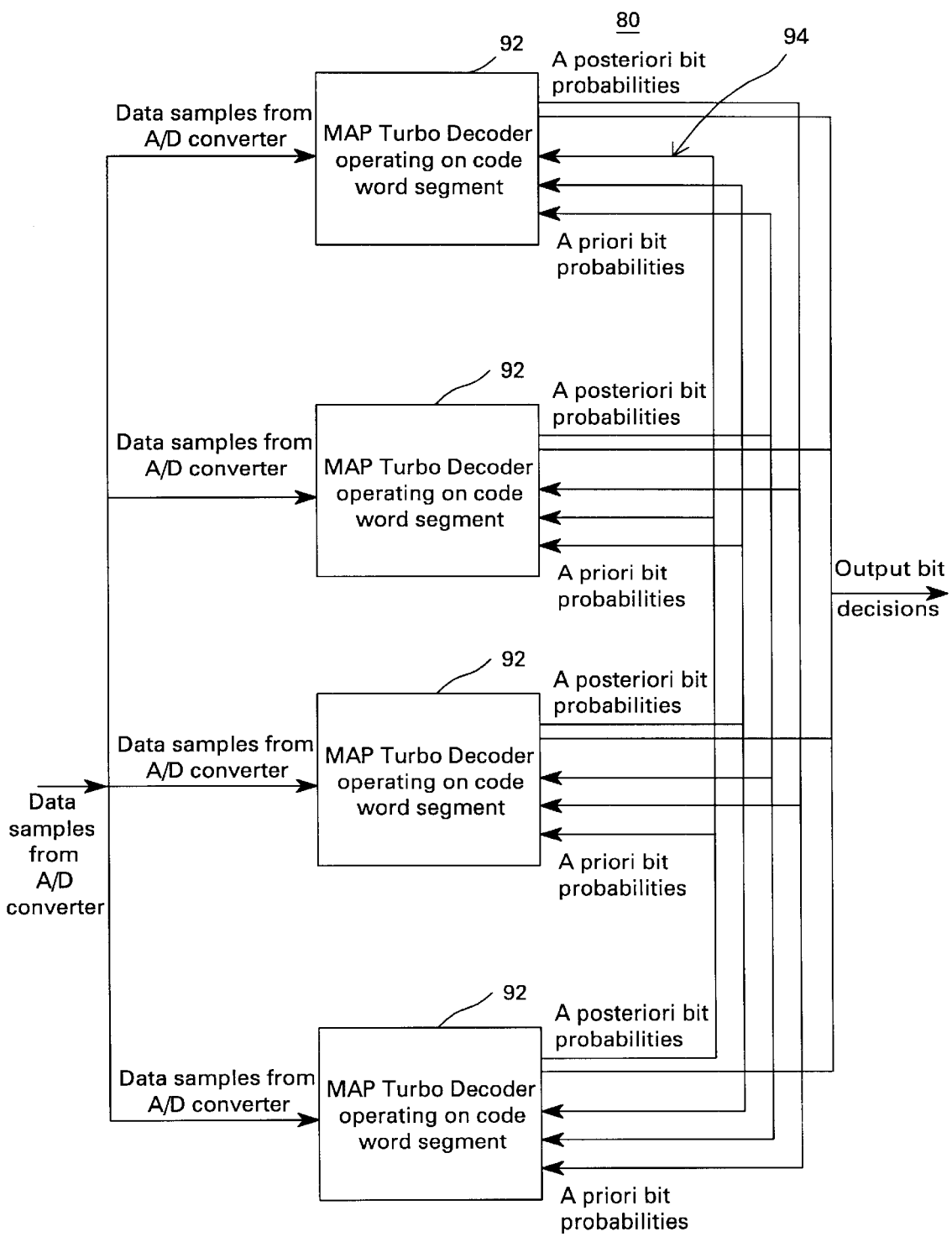
FIG. 5 is a block diagram illustrating an alternative exemplary embodiment of a turbo decoder system of the present invention, in which the interleaver and de-interleaver have been implemented in the MAP turbo decoder module.

Another alternative embodiment, illustrated in FIG. 5, is constructed such that the interleaving function performed between half-iterations is distributed among multiple decoder 92. With multi-chip interleaving capability built into each respective turbo decoder, the interleaving/de-interleaving block (FIG. 3) can be eliminated. In such case, all of the a posteriori bit probability estimates would be provided to all decoders. By way of example, FIG. 5 shows three input a priori bit probability buses 94 for each turbo decoder. Only three input buses are required to support concatenation of four chips since the output a posteriori probabilities can be stored in internal memory in addition to being provided as outputs of the chips. The data samples from the A/D converter (not shown) are provided to all four chips 92. However, only the data samples corresponding to the segment that each respective turbo decoder chip is designated to decode are stored in internal memory of the respective chip.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. A turbo decoder system, comprising:

a plurality M of turbo decoder modules, each for decoding a maximum code-word size corresponding to N information bits according to a turbo decoding algorithm;

interleaver/de-interleaver circuitry for receiving input data samples corresponding to (M·N) information bits and for receiving a priori bit probabilities, the interleaver/de-interleaver circuitry having predetermined interleaver and de-interleaver definitions, the interleaver/de-interleaver circuitry segmenting the input data samples into M segments, each segment being provided to a respective turbo decoder module which provides as output a posteriori bit probabilities based on the corresponding segment of input data samples, the interleaver/de-interleaver circuitry re-ordering the a posteriori bit probabilities according to the interleaver definition upon the end of odd-numbered half iterations and according to the de-interleaver definition upon the end of even-numbered half iterations.

2. The turbo decoder system of claim 1 wherein each respective turbo decoder module comprises a common input bus for the input data samples and the a priori bit probability values.

3. The turbo decoder system of claim 1 wherein the turbo decoding algorithm comprises a MAP decoding algorithm.

4. A turbo decoder system, comprising:

a plurality M of turbo decoder modules, each for decoding a maximum code-word size corresponding N information bits according to a turbo decoding algorithm, each turbo decoder module comprising a double buffer structure for storing non-interleaved and interleaved data samples at the start of each input data sample corresponding to a turbo code word;

interleaver/de-interleaver circuitry for receiving input data samples corresponding to (M·N) information bits and for receiving a priori bit probabilities, the interleaver/de-interleaver circuitry having predetermined interleaver and de-interleaver definitions, the interleaver/de-interleaver circuitry segmenting the input data samples into M segments, each segment being provided to a respective turbo decoder module which provides as output a posteriori bit probabilities based on the corresponding segment of input data samples, the interleaver/de-interleaver circuitry re-ordering the a posteriori bit probabilities according to the interleaver definition upon the end of odd-numbered half iterations and according to the de-interleaver definition upon the end of even-numbered half iterations.

5. The turbo decoder system of claim 4 wherein each respective turbo decoder module comprises a common input bus for the input data samples and the a priori bit probability values.

6. The turbo decoder system of claim 4 wherein the turbo decoding algorithm comprises a MAP decoding algorithm.

* * * * *